(12) United States Patent
Hiraka

(10) Patent No.: US 10,133,118 B2
(45) Date of Patent: Nov. 20, 2018

(54) LIGHT FLUX CONTROL MEMBER WITH AN ANNULAR GROOVE

(71) Applicant: Enplas Corporation, Saitama (JP)

(72) Inventor: Kensuke Hiraka, Saitama (JP)

(73) Assignee: ENPLAS CORPORATION, Saitama (JP)

( * ) Notice: Subject to any disclaimer, the term of this patent is extended or adjusted under 35 U.S.C. 154(b) by 0 days.

(21) Appl. No.: 15/129,457

(22) PCT Filed: Feb. 27, 2015

(86) PCT No.: PCT/JP2015/055746
§ 371 (c)(1),
(2) Date: Sep. 27, 2016

(87) PCT Pub. No.: WO2015/151675
PCT Pub. Date: Oct. 8, 2015

(65) Prior Publication Data
US 2017/0115531 A1    Apr. 27, 2017

(30) Foreign Application Priority Data

Apr. 2, 2014  (JP) ................................ 2014-076152

(51) Int. Cl.
*G02F 1/1335*        (2006.01)

(52) U.S. Cl.
CPC .. *G02F 1/133606* (2013.01); *G02F 1/133603* (2013.01); *G02F 2001/133607* (2013.01)

(58) Field of Classification Search
CPC ......... G02F 1/133603; G02F 1/133606; G02F 2001/133607; G02F 1/315; G02F 2203/023; G02B 19/0028; G02B 19/0061; F21V 7/0091; F21V 5/04; F21V 5/045; F21V 5/046; F21V 5/048; F21V 13/04; H01L 33/58; H01L 33/60
See application file for complete search history.

(56) References Cited

U.S. PATENT DOCUMENTS

2009/0116245 A1    5/2009  Yamaguchi

FOREIGN PATENT DOCUMENTS

JP    2007-048883 A    2/2007
JP    2009-117207 A    5/2009
(Continued)

OTHER PUBLICATIONS

International Search Report from International Application No. PCT/JP2015/055746 dated Apr. 21, 2015.

*Primary Examiner* — Suezu Ellis
(74) *Attorney, Agent, or Firm* — Brundidge & Stanger, P.C.

(57) ABSTRACT

This light flux control member comprises an entry surface, a reflective surface, a circular groove containing a first circular surface and a second circular surface, and an exit surface. The circular groove is disposed in such a manner as not to intersect with the optical path of a light from the entry surface to the reflective surface, and, in such a manner as to intersect with at least a portion of the optical path of a light, from being emitted from a point other than the center of the light-emitting element, entering at the entry surface and being reflected at the reflective surface, to reaching the exit surface. The second circular surface is formed in such a manner that the width of the circular groove widens as the opening ridges of the circular groove is approached from the valley portion of the circular groove.

6 Claims, 10 Drawing Sheets

(56) References Cited

FOREIGN PATENT DOCUMENTS

| | | |
|---|---|---|
| JP | 2010-153328 A | 7/2010 |
| JP | 2011-023204 A | 2/2011 |
| JP | 2013-020716 A | 1/2013 |
| JP | 2014-7135 A | 1/2014 |
| WO | 2013/037288 A1 | 3/2013 |

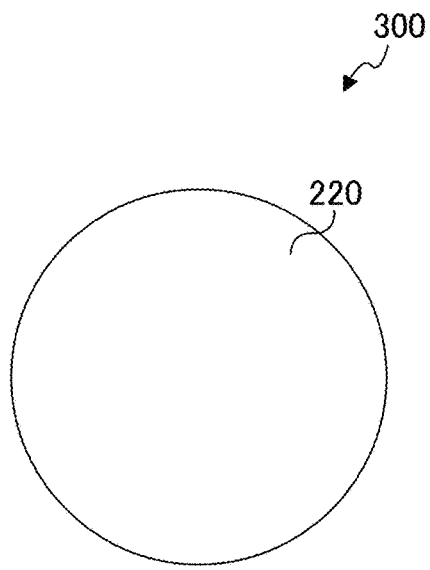
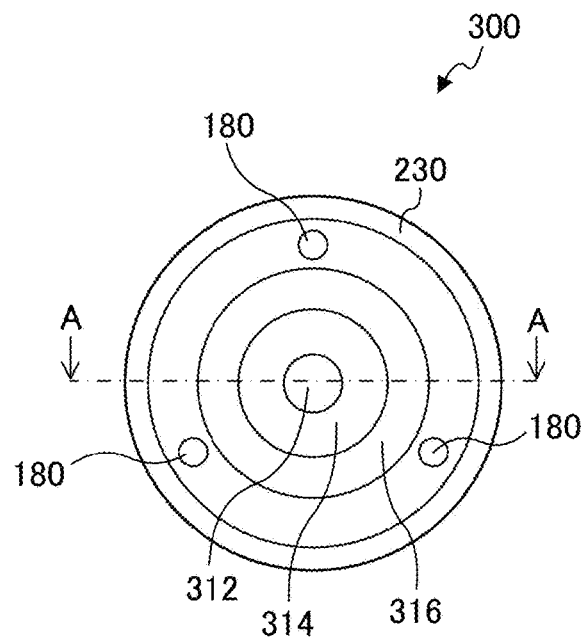
FIG. 7A  FIG. 7B
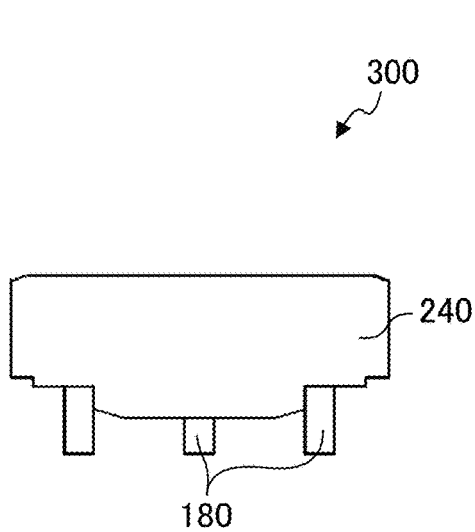
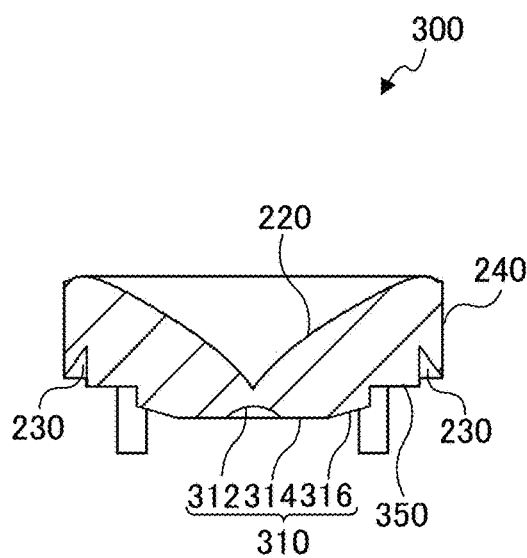
FIG. 7C  FIG. 7D

LIGHT FLUX CONTROL MEMBER WITH AN ANNULAR GROOVE

TECHNICAL FIELD

The present invention relates to a light flux controlling member that controls distribution of light emitted from a light emitting element. In addition, the present invention relates to a light-emitting device, a surface light source device and a display apparatus which include the light flux controlling member.

BACKGROUND ART

Some transmission type image display apparatuses such as liquid crystal display apparatuses use a direct surface light source device as a backlight. In recent years, direct surface light source devices having a plurality of light emitting elements as the light source have been used.

For example, a direct surface light source device includes a substrate, a plurality of light emitting elements, a plurality of light flux controlling members and a light diffusion member. The light emitting elements are disposed on the substrate in a matrix. A light flux controlling member configured to expand the light emitted from each light emitting element in the surface direction of the substrate is disposed above each light emitting element. The light emitted from the light flux controlling member is diffused by the light diffusion member so as to illuminate a member to be illuminated (for example, a liquid crystal panel) in a planar fashion (see, for example, PTL 1).

The surface light source device disclosed in PTL 1 includes a housing, a substrate disposed in the housing, a light emitting element disposed on the substrate, a light flux controlling member disposed on the substrate to cover the light emitting element and to control the distribution of the light emitted from the light emitting element (light direction conversion optical device), and a light diffusion member (diffusion transmission section) configured to allow the light emitted from the light flux controlling member to pass therethrough while diffusing the light. The light flux controlling member includes an incidence surface on which the light emitted from the light emitting element is incident, a reflection surface formed on the side opposite to the incidence surface and configured to reflect the incident light in the lateral direction, and an emission surface configured to emit the light reflected by the reflection surface.

The light emitted from the light emitting element is incident on the light flux controlling member from the incidence surface. The light incident on the light flux controlling member is laterally reflected by the reflection surface, and emitted to the outside of the light flux controlling member from the emission surface.

CITATION LIST

Patent Literature

PTL 1
Japanese Patent Application Laid-Open No. 2007-048883

SUMMARY OF INVENTION

Technical Problem

However, in the surface light source device disclosed in PTL 1, a part of the light laterally emitted from the emission surface directly travels through the air and reaches the housing. In this manner, a part of the light emitted from the emission surface does not reach the light diffusion member while being attenuated, and thus does not used in some situation. As such, disadvantageously, the surface light source device disclosed in PTL 1 cannot sufficiently use the light emitted from the light emitting element.

In view of this, an object of the present invention is to provide a light flux controlling member which can increase the use efficiency of the light emitted from a light emitting element.

In addition, anther object of the present invention is to provide a light-emitting device, a surface light source device and a display apparatus which include the light flux controlling member.

Solution to Problem

A light flux controlling member according to embodiments of the present invention is a member for controlling a distribution of light emitted from a light emitting element, and includes: an incidence surface on which light emitted from the light emitting element is incident, the incidence surface being disposed on a rear side to intersect with a central axis thereof; a reflection surface configured to reflect light incident on the incidence surface in a lateral direction, the reflection surface being disposed on a front side such that a distance from the light emitting element increases from a center portion toward an outer periphery portion thereof; an annular groove including a first annular surface and a second annular surface and disposed on a rear side at a position outside the incidence surface to surround the central axis, the first annular surface being disposed on the central axis side, the second annular surface being disposed outside the first annular surface; and an emission surface configured to emit light reflected by the reflection surface, the emission surface being disposed outside the annular groove to surround the central axis. The annular groove is disposed such that the annular groove does not intersect with a light path of light emitted from a center of the light emitting element in a region from a point of incidence of the light on the incidence surface to a point of reflection of the light at the reflection surface and that the annular groove intersects with at least a part of a light path of light which is emitted from the light emitting element and is incident on the incidence surface in a region from a point of reflection of the light at the reflection surface to a point of arrival of the light at the emission surface, and the second annular surface is formed such that a width of the annular groove increases toward an opening edge of the annular groove from a valley part of the annular groove, the second annular surface being configured to refract, toward the front side, light emitted from the light emitting element which is incident on the incidence surface and is reflected by the reflection surface.

A light-emitting device according to embodiments of the present invention includes: a light emitting element, and the above-mentioned light flux controlling member. The light flux controlling member is disposed such that the central axis coincides with an optical axis of the light emitting element.

A surface light source device according to embodiments of the present invention includes: the above-mentioned light-emitting device; and a light diffusion member configured to allow light from the light-emitting device to pass therethrough while diffusing the light.

A display apparatus according to embodiments of the present invention includes: the above-mentioned surface light source device; and a display member to which light emitted from the surface light source device is applied.

Advantageous Effects of Invention

A light-emitting device which has the light flux controlling member and the light flux controlling member according to embodiments of present invention can increase the use efficiency of light emitted from a light emitting element. Accordingly, the surface light source device and the display apparatus according to the embodiments of the present invention can reduce luminance unevenness in comparison with the conventional apparatuses.

BRIEF DESCRIPTION OF DRAWINGS

FIGS. 7A to 7D are sectional views of a light flux controlling member according to Embodiment 2;

DESCRIPTION OF EMBODIMENTS

In the following, embodiments of the present invention are described in detail with reference to the accompanying drawings. In the following description, as a typical example of the surface light source device according to the embodiments of the present invention, a surface light source device suitable for a backlight of a liquid crystal display apparatus will be described. With a member (for example, a liquid crystal panel) configured to be irradiated with light from the surface light source device, the surface light source device can be used as a display apparatus.

Embodiment 1

(Configurations of Surface Light Source Device and Light-Emitting Device)

Figure 1A:
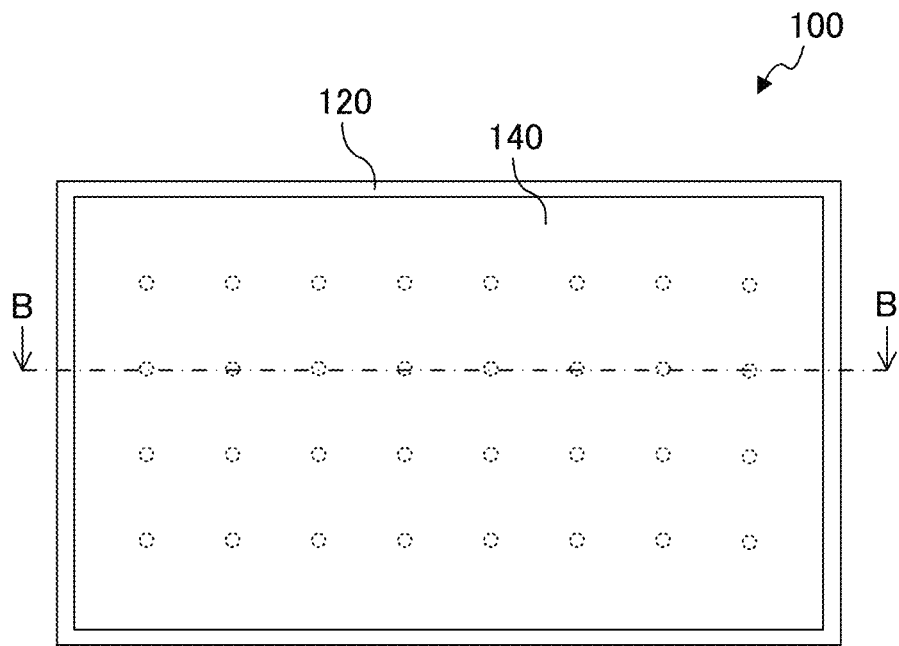
FIGS. 1A and 1B illustrate an external appearance of a configuration of a surface light source device according to Embodiment 1.
Figure 1B:
Figure 2A:
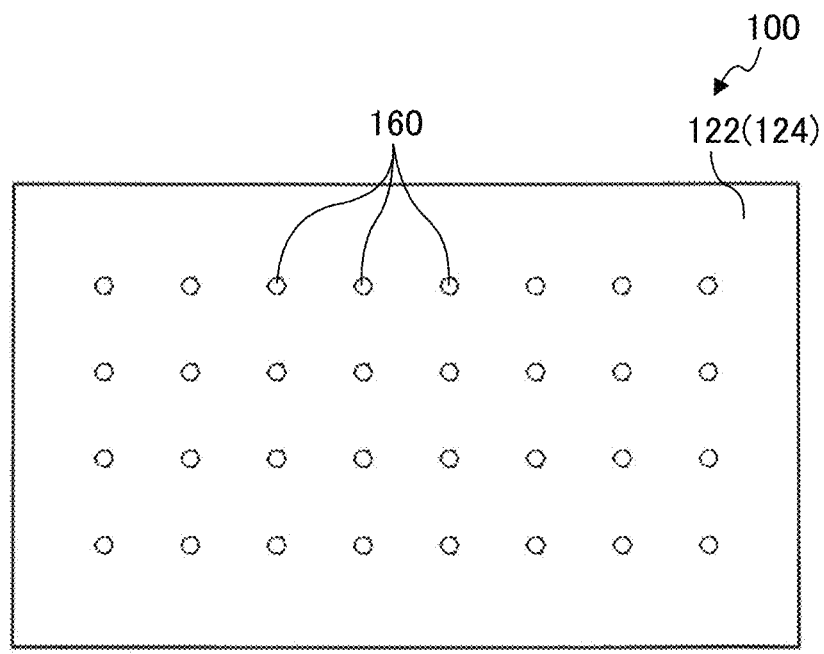
FIGS. 2A and 2B are sectional views illustrating a configuration of the surface light source device according to Embodiment 1.
Figure 2B:
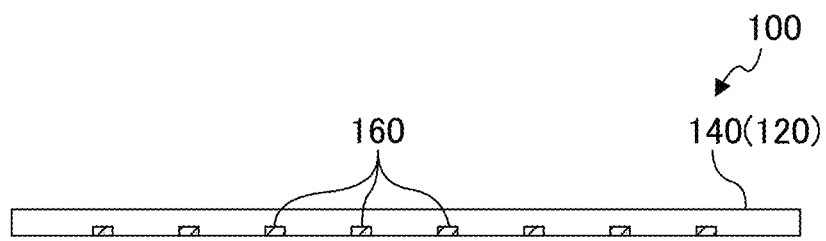
Figure 3:
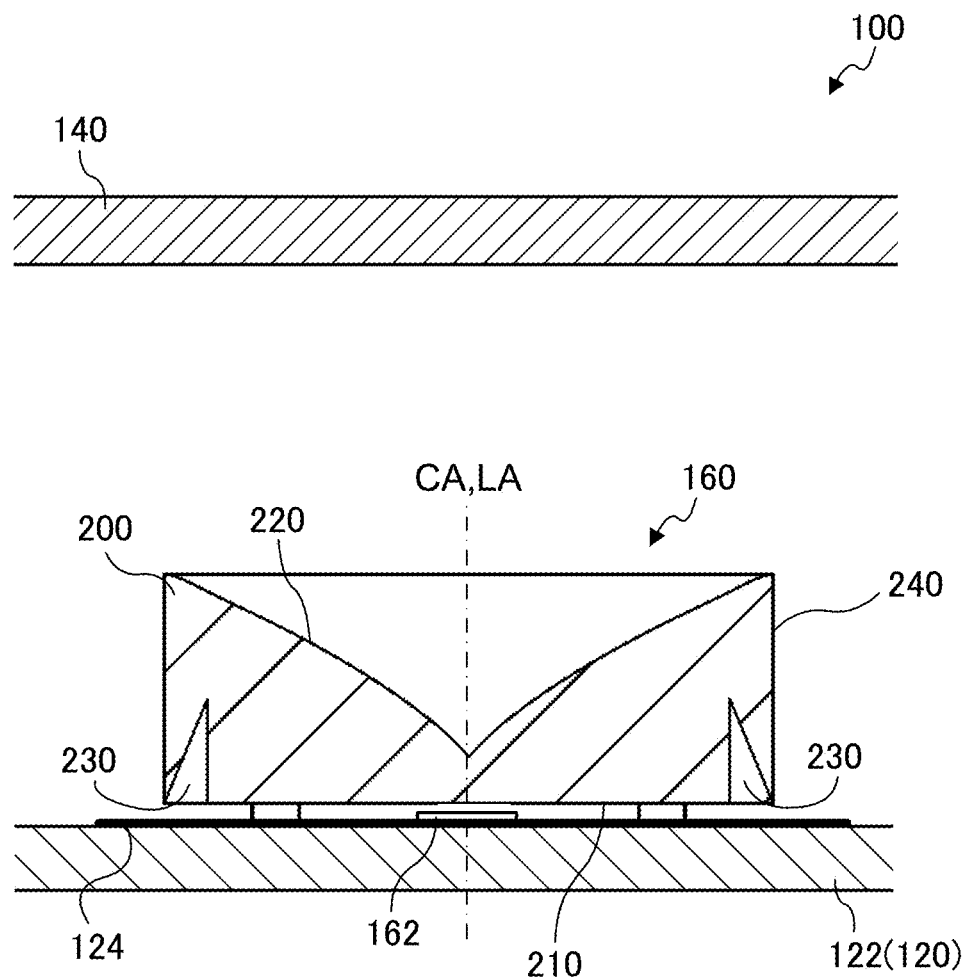
FIG. 3 is a partially enlarged sectional views of FIG. 2B.

FIGS. 1 to 3 illustrate a configuration of surface light source device 100 according to Embodiment 1. FIG. 1A is a plan view of surface light source device 100 according to Embodiment 1, and FIG. 1B is a front view of surface light source device 100. FIG. 2A is a sectional view taken along line A-A of FIG. 1B, and FIG. 2B is a sectional view taken along line B-B of FIG. 1A. FIG. 3 is a partially enlarged sectional view of FIG. 2B.

As illustrated in FIG. 1A to FIG. 2B, surface light source device 100 according to Embodiment 1 includes housing 120, light diffusion member 140 and a plurality of light-emitting devices 160. Light-emitting devices 160 are disposed on bottom plate 122 of housing 120 in a matrix. The internal surface of bottom plate 122 functions as a diffusion reflection surface. In addition, a top plate of housing 120 is provided with an opening. Light diffusion member 140 is disposed in such a manner as to close the opening, and functions as a light emitting surface. The size of the light emitting surface is not limited, and is, for example, approximately 400 mm×approximately 700 mm (32 inch).

As illustrated in FIG. 3, light-emitting devices 160 are fixed on respective substrates 124. A plurality of substrates 124 are fixed at respective positions on bottom plate 122 of housing 120. Each of light-emitting devices 160 includes light emitting element 162 and light flux controlling member 200.

Light emitting element 162 is a light source of surface light source device 100, and is mounted on substrate 124. Light emitting element 162 is, for example, a light-emitting diode (LED) such as a white light-emitting diode.

Light flux controlling member 200 is a diffusion lens configured to control the distribution of light emitted from light emitting element 162, and is fixed on substrate 124. Light flux controlling member 200 is disposed over light emitting element 162 in such a manner that its central axis CA coincides with optical axis LA of light emitting element 162. It is to be noted that each of reflection surface 220 and emission surface 240 of light flux controlling member 200 described later is rotationally symmetric (circularly symmetric), and the rotational axes thereof coincide with each other. The rotational axes of reflection surface 220 and emission surface 240 are referred to as "central axis CA of the light flux controlling member." In addition, "optical axis LA of the light emitting element" means the central light beam of a stereoscopic light flux emitted from light emitting element 162. A gap for dissipating the heat emitted from light emitting element 162 to the outside is formed between substrate 124 on which light emitting element 162 is mounted and incidence surface 210 of light flux controlling member 200.

Light flux controlling member 200 is formed by integral molding. The material of light flux controlling member 200 is not particularly limited as long as the light having a desired wavelength can pass through the material. Examples of the material of light flux controlling member 200 include: light transmissive resins such as polymethylmethacrylate (PMMA), polycarbonate (PC), and epoxy resin (EP); or glass.

Surface light source device 100 according to the present embodiment is characterized mainly by the configuration of light flux controlling member 200. In view of this, the details of light flux controlling member 200 are described later.

Light diffusion member 140 is a plate-shaped member having a light diffusing property and allows the light emitted from light-emitting device 160 to pass therethrough while diffusing the light. Normally, the size of light diffusion member 140 is substantially the same as that of the member to be irradiated such as a liquid crystal panel. For example, light diffusion member 140 is formed of a light transmissive resin such as polymethylmethacrylate (PMMA), polycarbonate (PC), polystyrene (PS), and styrene methyl methacrylate copolymerization resin (MS). In order to provide a light diffusing property, minute irregularities are formed on the surface of light diffusion member 140, or diffusing members such as beads are dispersed in light diffusion member 140.

In surface light source device 100 according to the present embodiment, light emitted from light emitting elements 162 are expanded by respective light flux controlling members 200 so as to illuminate a wide range of light diffusion member 140. The light emitted from each light flux controlling member 200 is further diffused by light diffusion member 140. As a result, surface light source device 100 according to the present embodiment can uniformly illuminate a planar member (for example, a liquid crystal panel).

(Configuration of Light Flux Controlling Member)

Figure 4A:
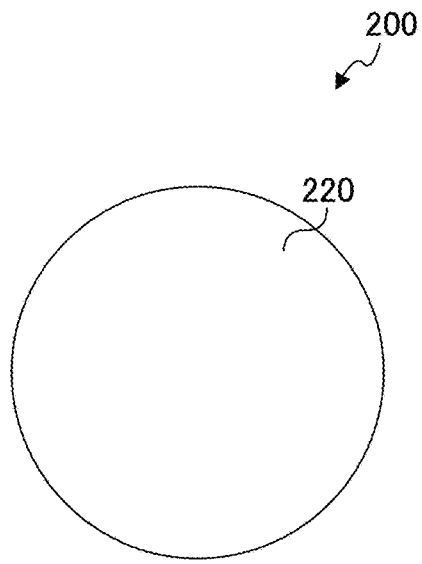
FIGS. 4A to 4D illustrate a configuration of the light flux controlling member according to Embodiment 1.
Figure 4B:
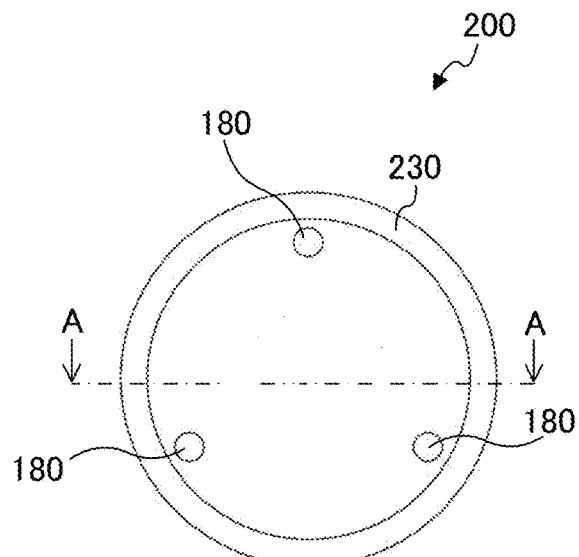
Figure 4C:
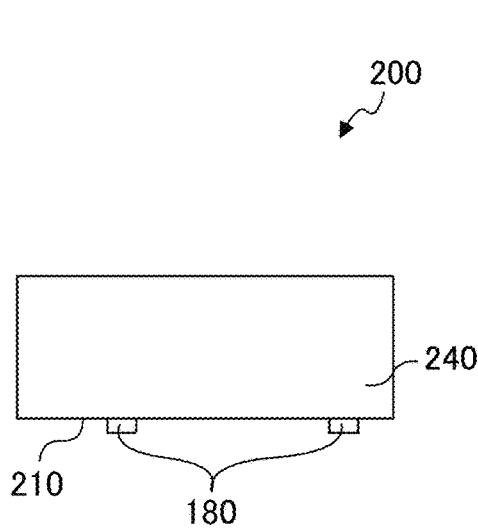
Figure 4D:
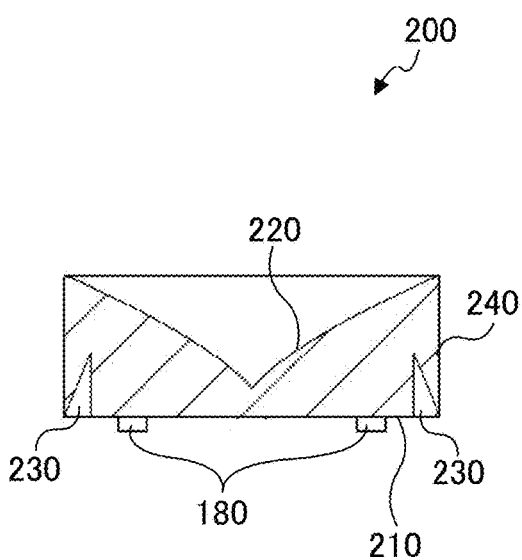
Figure 5:
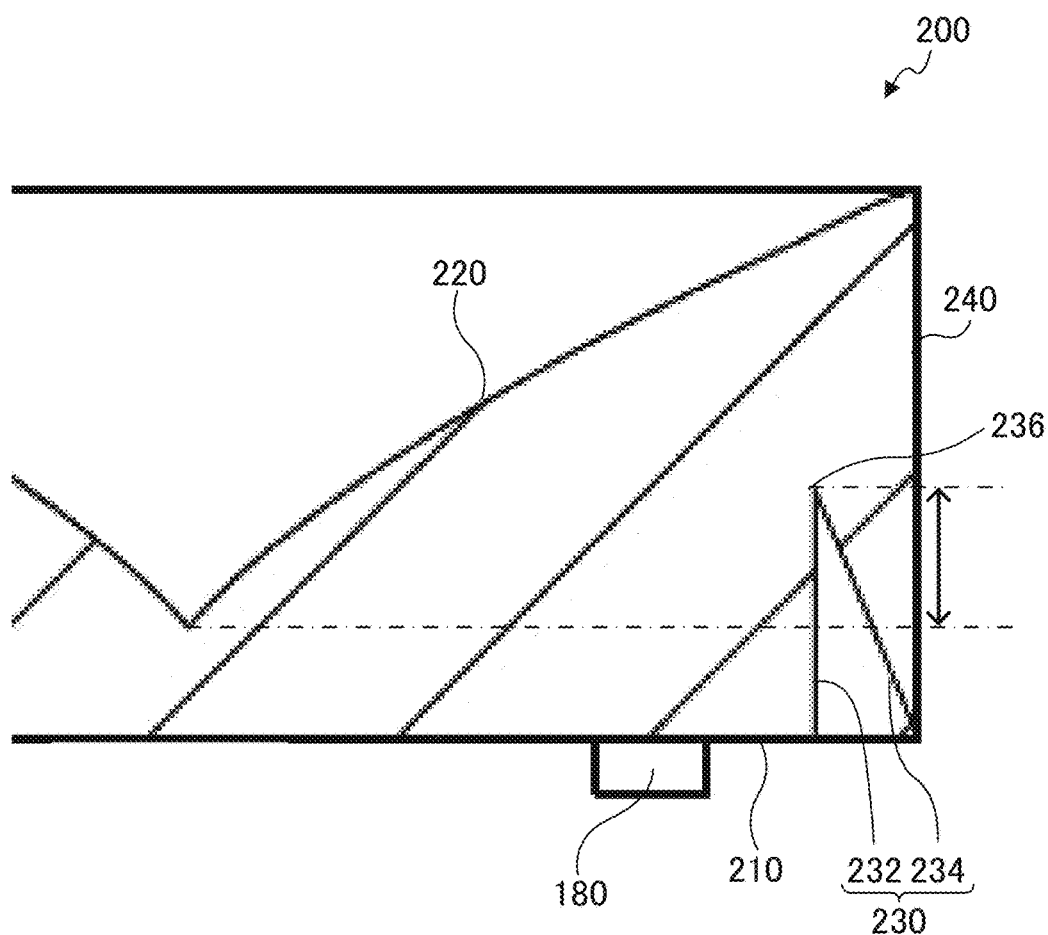
FIG. 5 is a partially enlarged sectional view of FIG. 4D.

FIG. 4A to FIG. 4D and FIG. 5 illustrate a configuration of light flux controlling member 200 according to Embodiment 1. FIG. 4A is a plan view of light flux controlling member 200 according to Embodiment 1, FIG. 4B is a bottom view of light flux controlling member 200, FIG. 4C is a side view of light flux controlling member 200, and FIG. 4D is a sectional view taken along line A-A of FIG. 4B. FIG. 5 is a partially enlarged sectional view of FIG. 4D.

As illustrated in FIG. 4A to FIG. 4D and FIG. 5, light flux controlling member 200 includes incidence surface 210, reflection surface 220, annular groove 230 and emission surface 240.

Incidence surface 210 is a plane disposed at a center portion on the rear (light emitting element 162) side of light flux controlling member 200. Incidence surface 210 is orthogonal to optical axis LA, and refracts the incident light toward reflection surface 220. The shape in plan view of incidence surface 210 is not limited, and incidence surface 210 has a circular shape in plan view in the present embodiment.

Light incident on incidence surface 210 is laterally reflected by reflection surface 220. Light flux reflection surface 220 is a surface rotationally symmetrical (circularly symmetrical) about central axis CA of controlling member 200. In addition, the generatrix of the rotationally symmetrical surface extending from the center to the outer periphery portion thereof is a recessed curve with respect to light emitting element 162, and reflection surface 220 is a curved surface obtained by rotating the generatrix 360 degrees about central axis CA (see FIG. 4). That is, reflection surface 220 has a curved surface having an aspherical shape whose height from light emitting element 162 increases from the center portion toward the outer periphery portion. In addition, the external peripheral portion of reflecting surface 220 is formed at a position distant from light-emitting element 162 in the direction of optical axis LA of light-emitting elements 162 (in height) relative to the center of reflecting surface 220. For example, reflecting surface 220 is a curved surface of an aspherical shape whose height from light-emitting element 162 increases from the center toward the external peripheral portion, or a curved surface of an aspherical shape whose height from light-emitting element 162 (substrate 124) increases from the center portion toward a predetermined point and whose height from light-emitting element 162 decreases from the predetermined point toward the external peripheral portion. In the former case, the inclination angle of reflecting surface 220 relative to the surface direction of substrate 124 decreases from the center toward the external peripheral portion. In the latter case, on the other hand, reflecting surface 220 has a point where the inclination angle relative to the surface direction of substrate 124 is zero (in parallel with substrate 124) at a position nearer to the external peripheral portion between the center and the external peripheral portion. It is to be noted that, while the term "generatrix" generally means a straight line that defines a ruled surface, the term "generatrix" used in the present invention includes curves for defining total reflection surface 220 which is a rotationally symmetrical surface.

Annular groove 230 is disposed on the rear side to surround central axis CA at a position on the outside relative to incidence surface 210. Annular groove 230 refracts a part of the light reflected by reflection surface 220 toward the front side. Annular groove 230 includes first annular surface 232 and second annular surface 234. The cross-sectional shape including central axis CA of annular groove 230 is not limited as long as first annular surface 232 and second annular surface 234 are provided and the above-described function can be achieved. In the present embodiment, the cross-sectional shape of annular groove 230 including central axis CA is a triangular shape. Specifically, in the present embodiment, ridgeline 236 is formed at a valley part between first annular surface 232 and second annular surface 234. Annular groove 230 is formed such that the width of the groove increases from the valley part toward the opening edge. In addition, the depth of annular groove 230 in the cross-section including central axis CA may be constant or varied in the circumferential direction around central axis CA as the rotational axis. In the present embodiment, the depth of annular groove 230 in the cross-section including central axis CA is constant in the circumferential direction around central axis CA as the rotational axis. In addition, the width of annular groove 230 in the cross-section including central axis CA may be constant or varied in the circumferential direction around central axis CA as the rotational axis. In the present embodiment, the width of annular groove 230 in the cross-section including central axis CA is constant in the circumferential direction around central axis CA as the rotational axis. That is, in the present embodiment, annular groove 230 is rotationally symmetrical about central axis CA. Preferably, the valley part of annular groove 230 is disposed on the front side relative to the center portion of reflection surface 220 (see the up-down arrow in FIG. 5). Here, the valley part of annular groove 230 means "the deepest position from the opening in annular groove 230."

First annular surface 232 is disposed on central axis CA side to surround central axis CA. The inclination direction of first annular surface 232 to central axis CA is not limited. First annular surface 232 may be disposed such that it approaches the front side of light flux controlling member 200 as the distance from central axis CA increases. That is, first annular surface 232 may have a shape of the side surface of an inverted truncated-cone shape. With this configuration, at the time of the injection molding of light flux controlling member 200, light flux controlling member 200 is easily removed from the metal mold. In addition, first annular surface 232 may be disposed parallel to central axis CA. That is, first annular surface 232 may have a shape of the side surface of a column Second annular surface 234 is disposed on the outside relative to first annular surface 232 to surround central axis CA. In addition, second annular surface 234 is disposed such that it approaches the rear side from central axis CA side (center portion) toward the outer periphery portion. The cross-sectional shape including central axis CA of second annular surface 234 is not limited. The cross-sectional shape including central axis CA of second annular surface 234 includes a straight line or a curved line. Examples of the curved line include an arc whose curvature center is located on the outside, an arc whose curvature center is located on the inside, and the like. In the present embodiment, the cross-sectional shape including central axis CA of second annular surface 234 is a straight line. That is, second annular surface 234 has a shape of the side surface of a truncated cone.

Ridgeline 236 is a boundary line between first annular surface 232 and second annular surface 234, and is disposed to surround central axis CA. Preferably, ridgeline 236 (the valley part of annular groove 230) is disposed on the front side relative to the center portion of reflection surface 220 (see the up-down arrow in FIG. 5).

Emission surface 240 emits the light reflected by reflection surface 220 to the outside of light flux controlling member 200. Emission surface 240 is disposed to surround central axis CA. In the present embodiment, emission surface 240 is a curved surface extending along central axis CA. In the cross-section including central axis CA, the upper end of emission surface 240 is connected with reflection surface 220. On the other hand, in the cross-section including central axis CA, the lower end of emission surface 240 is connected with second annular surface 234.

Leg part 180 is a part for setting the position of the light flux controlling member main body including incidence surface 210, reflection surface 220, annular groove 230 and emission surface 240 with respect to substrate 124. In the present embodiment, three leg parts 180 are disposed on incidence surface 210.

(Simulation)

With light flux controlling member 200 of Embodiment 1, the light path of the light emitted from light emitting element 162 was simulated. In addition, a similar simulation was conducted with light flux controlling member 200' provided with no annular groove 230 (hereinafter also referred to as "light flux controlling member 200' according to the comparative example") for comparison.

Figure 6A:
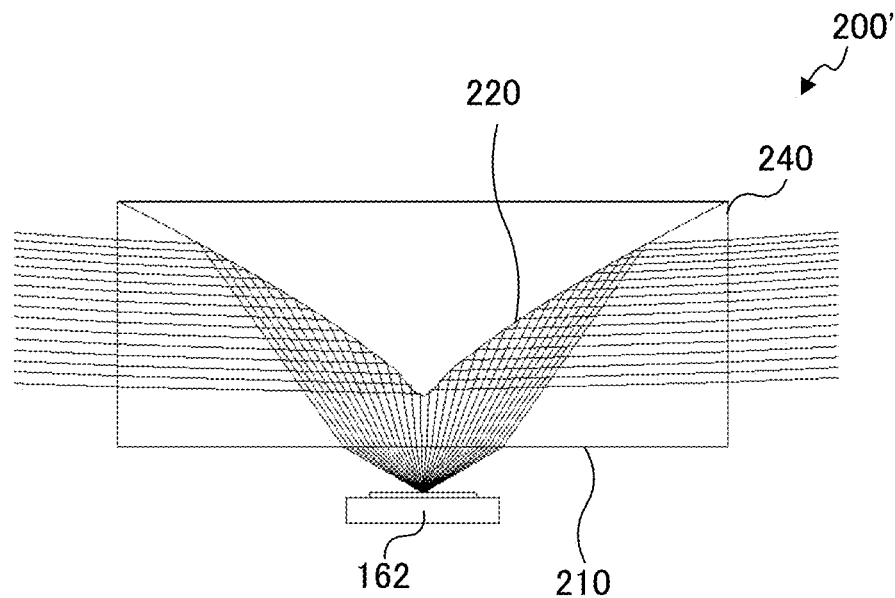
FIGS. 6A and 6B illustrate simulations of light paths in light flux controlling members according to Embodiment 1 and Comparative Example 1.
Figure 6B:
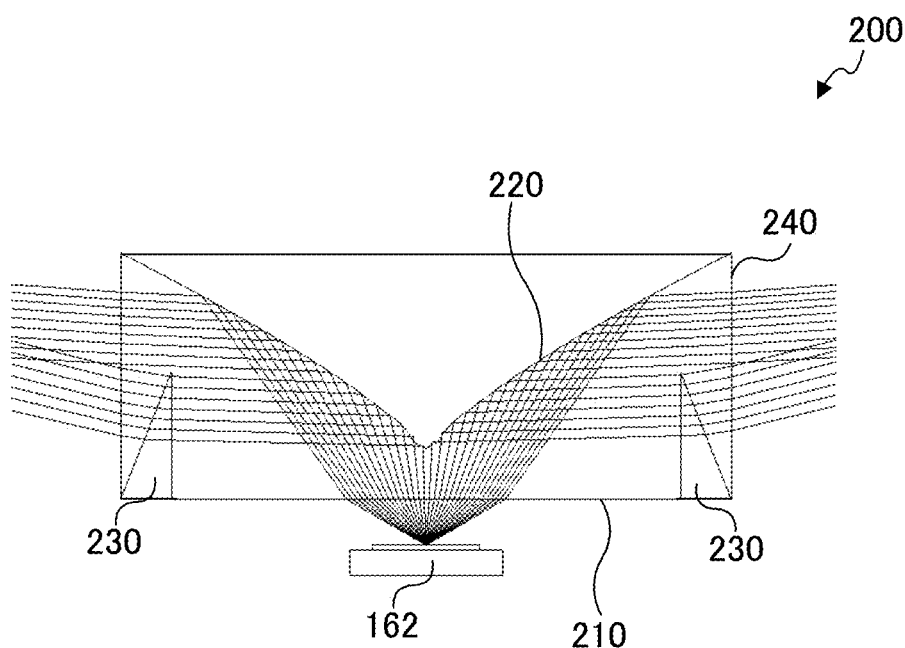

FIG. 6A illustrates light paths of the light emitted from the center of the light emitting surface of light emitting element 162 in light flux controlling member 200' according to Comparative Example 1, and FIG. 6B illustrates light paths of the light emitted from the center of the light emitting surface of light emitting element 162 in light flux controlling member 200 according to Embodiment 1. It is to be noted that leg part 180 is omitted in FIG. 6A and FIG. 6B.

As illustrated in FIG. 6A, in light flux controlling member 200' according to Comparative Example 1, a part of light emitted from the center of light emitting element 162 is incident on incidence surface 210, and is refracted toward reflection surface 220. The light having entered light flux controlling member 200' is laterally reflected by reflection surface 220. Then, the light reflected by reflection surface 220 is emitted to the outside of light flux controlling member 200' from emission surface 240. At this time, the light emitted from light flux controlling member 200' advances in the lateral direction.

On the other hand, as illustrated in FIG. 6B, in light flux controlling member 200 according to Embodiment 1, a part of the light emitted from the center of light emitting element 162 is incident on incidence surface 210, and is refracted toward reflection surface 220. The light having entered light flux controlling member 200 is laterally reflected by reflection surface 220. Then, a part of the light reflected by reflection surface 220 (the light reflected by reflection surface 220 at a portion on emission surface 240 side) is emitted from emission surface 240 to the outside of light flux controlling member 200. In addition, a part of the light reflected by reflection surface 220 (the light reflected by reflection surface 220 at a portion on central axis CA side) is emitted from first annular surface 232 to the outside of light flux controlling member 200. At this time, since first annular surface 232 is substantially parallel to central axis CA, the light emitted at first annular surface 232 is not largely refracted. In addition, the light emitted from first annular surface 232 enters light flux controlling member 200 from second annular surface 234. At this time, the light incident on second annular surface 234 is largely refracted toward the front side since second annular surface 234 is disposed to approach the rear side from the center portion toward the outer periphery portion. In this manner, a part of the light reflected on the rear side of reflection surface 220 is refracted toward the front side by first annular surface 232 and second annular surface 234. Then, the light refracted toward the front side is emitted from emission surface 240 to the outside of light flux controlling member 200.

(Effect)

As described above, in light flux controlling member 200 according to Embodiment 1, annular groove 230 for refracting light to the front side is formed on a part of the light path of the light reflected by reflection surface 220, and therefore a part of the light reflected by reflection surface 220 is emitted toward the front side. Thus, light flux controlling member 200 according to Embodiment 1 can efficiently use the light emitted from light emitting element 162. In addition, in surface light source device 100 according to Embodiment 1, the waveform of the illuminance distribution can be improved.

Embodiment 2

The surface light source device according to Embodiment 2 is different from surface light source device 100 according to Embodiment 1 only in the configuration of light flux controlling member 300. In view of this, only light flux controlling member 300 according to Embodiment 2 is described below.

(Configuration of Light Flux Controlling Member)

FIGS. 7A to 7D illustrate a configuration of light flux controlling member 300 according to Embodiment 2. FIG. 7A is a plan view of light flux controlling member 300 according to Embodiment 2, FIG. 7B is a bottom view of light flux controlling member 300, FIG. 7C is a front view of light flux controlling member 300, and FIG. 7D is a sectional view taken along line A-A of FIG. 7B.

As illustrate in FIGS. 7A to 7D, light flux controlling member 300 according to Embodiment 2 of the present invention includes incidence surface 310, reflection surface 220, annular groove 230, emission surface 240 and inspection reference surface 350.

Incidence surface 310 includes an inner incidence surface including recessed surface 312 and rear surface 314, and an outer inclined surface including inclined surface 316.

Recessed surface 312 is formed at a center portion of the rear side (light emitting element 162 side) of light flux controlling member 300. Recessed surface 312 allows for incidence of a part of the light emitted from light emitting element 162. In the present embodiment, recessed surface 312 is a rotationally symmetrical (circularly symmetrical) surface having a substantially spherical cap shape which is formed so as to approach light emitting element 162 as the distance from optical axis LA increases. The central axis of recessed surface 312 and central axis CA of light flux controlling member 300 coincide with each other. In the light emitted from light emitting element 162, light having a small angle to optical axis LA is incident on recessed surface 312.

Rear surface 314 is disposed outside recessed surface 312. Rear surface 314 allows for incidence of a part of the light emitted from light emitting element 162. In the present embodiment, rear surface 314 is a plane perpendicular to central axis CA. Rear surface 314 extends from the outer peripheral edge of recessed surface 312 in the direction orthogonal to central axis CA. In the light emitted from light emitting element 162, light having a larger angle to optical axis LA than that of the light incident on recessed surface 312 is incident on rear surface 314.

Inclined surface 316 is disposed outside rear surface 314. Inclined surface 316 allows for incidence of a part of the light emitted from light emitting element 162. Inclined surface 316 is disposed such that the distance from light emitting element 162 increases as the distance from central axis CA (optical axis LA) increases. Inclined surface 316 is formed at an angle at which inclined surface 316 does not intersect with the light path of the light which is emitted from the center of the light emitting surface of light emitting element 162 and is incident on the outer edge of the inner incidence surface. That is, in the light emitted from the center of the light emitting surface of light emitting element 162, light having a larger angle to optical axis LA than that of the light incident on rear surface 314 is not incident on the inclined surface, and a part of the light emitted from an end portion of light emitting element 162 is incident on inclined surface 316.

Inspection reference surface 350 is disposed on the front side relative to inclined surface 316, and on the outside of inclined surface 316. The light emitted from the center of the light emitting surface of light emitting element 162 does not directly reach inspection reference surface 350. Inspection reference surface 350 is a plane perpendicular to central axis CA. Inspection reference surface 350 extends from the outer peripheral edge of inclined surface 316 in the direction orthogonal to central axis CA. Leg part 180 is fixed on inspection reference surface 350. With this configuration, the size in the height direction of leg part 180, emission surface 240 described later and the like of light flux controlling member 300 can be easily inspected based on inspection reference surface 350. In the present embodiment, leg part 180 is provided on inspection reference surface 350.

Annular groove 230 is disposed outside inspection reference surface 350 on the rear side.

(Simulation)

Figure 8:
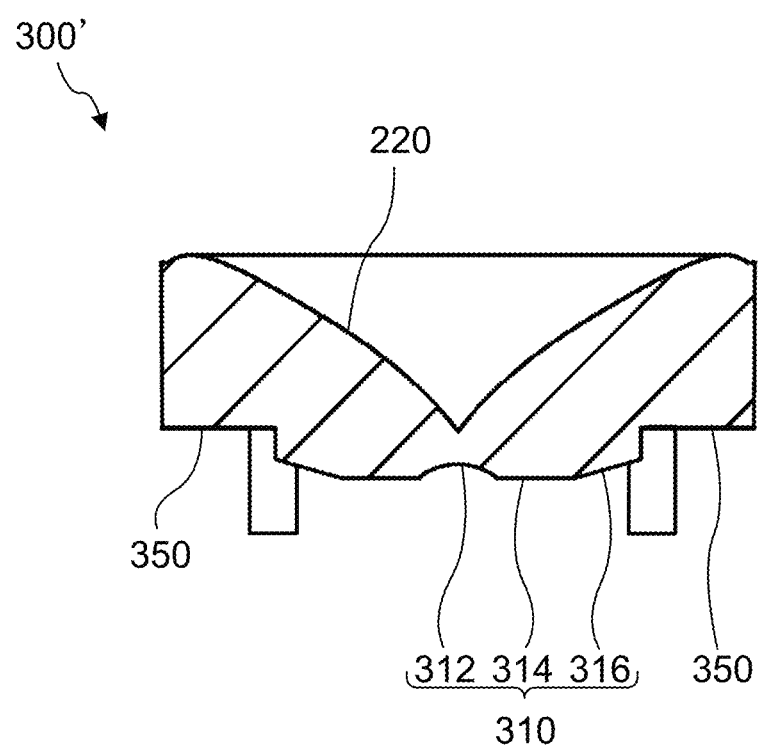
FIG. 8 is a sectional view of the light flux controlling member according to the comparative example.

In light flux controlling member 300 according to Embodiment 2, the light path of light emitted from light emitting element 162, and brightness on the diffusion plate when the diffusion plate is installed on light flux controlling member 300 were simulated. In addition, a similar simulation was conducted with light flux controlling member 300' provided with no annular groove 230 (hereinafter also referred to as "light flux controlling member according to the comparative example 2"; see FIG. 8) for comparison. While the effect of the light emitted from the center of light emitting element 162 was confirmed in the simulation in Embodiment 1, the effect of the light emitted from an end portion of light emitting element 162 was also confirmed in Embodiment 2.

Figure 9A:
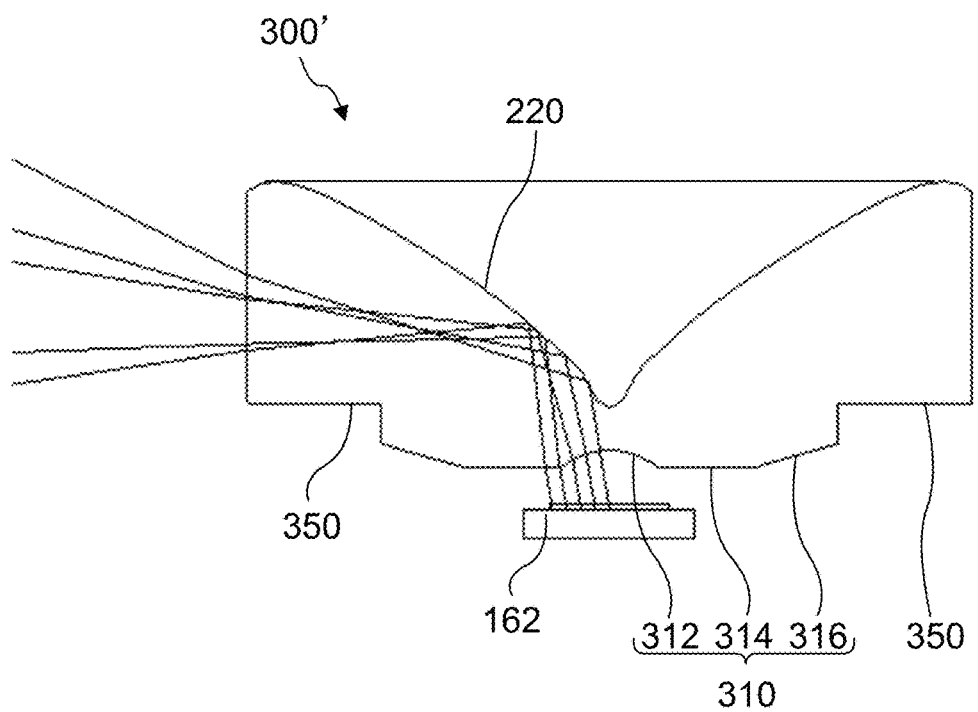
FIGS. 9A and 9B illustrate simulations of light paths in light flux controlling members according to Embodiment 2 and Comparative Example 2.
Figure 9B:
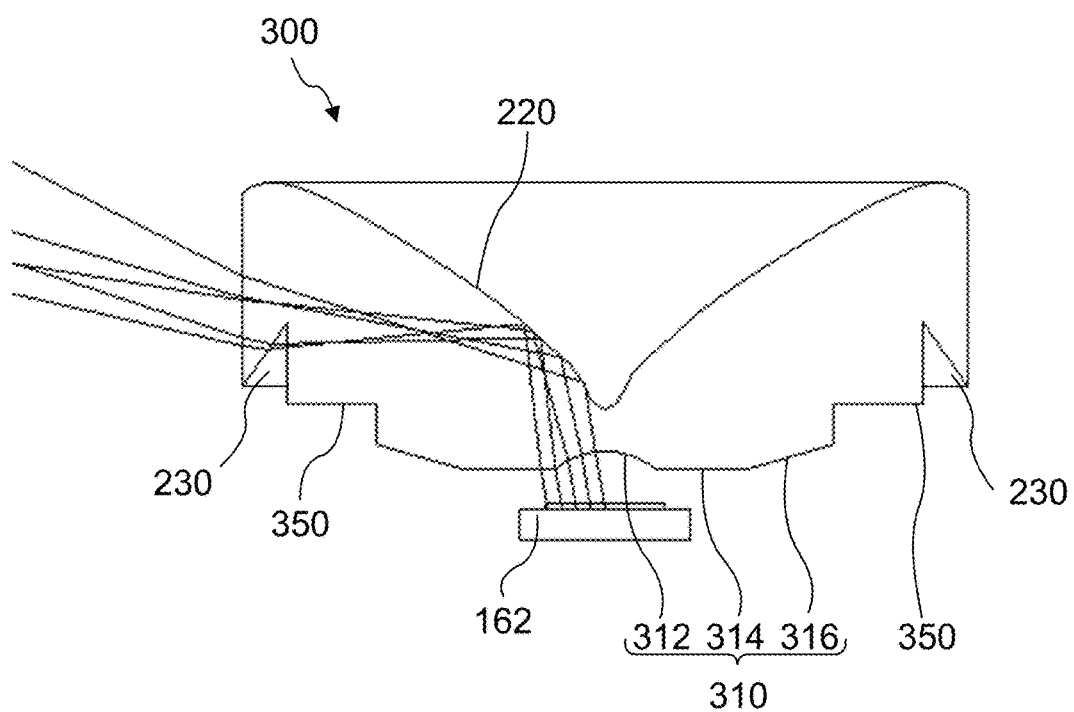

FIG. 9A illustrates light paths of light emitted from the light emitting surface of light emitting element 162 in light flux controlling member 300' according to the comparative example 2, and FIG. 9B illustrates light paths of light emitted from the light emitting surface of light emitting element 162 in light flux controlling member 300 according to Embodiment 2. It is to be noted that hatching and leg part 180 are omitted in FIG. 9A and FIG. 9B.

As illustrated in FIG. 9A, in light flux controlling member 300' according to the comparative example, a part of the light emitted from light emitting element 162 is incident on incidence surface 310 and is refracted toward reflection surface 220. The light having entered light flux controlling member 300' is laterally reflected by reflection surface 220. Then, the light reflected by reflection surface 220 is emitted to the outside of light flux controlling member 300' from emission surface 240.

On the other hand, as illustrated in FIG. 9B, in light flux controlling member 300 according to Embodiment 2, a part of the light emitted from light emitting element 162 is incident on incidence surface 310, and refracted toward reflection surface 220. The light having entered light flux controlling member 300 is laterally reflected by reflection surface 220. Then, a part of the light reflected by reflection surface 220 (the light reflected by reflection surface 220 at a portion on emission surface 240 side) is emitted to the outside of light flux controlling member 300 from emission surface 240. In addition, a part of the light reflected by reflection surface 220 (the light reflected by reflection surface 220 at a portion on central axis CA side) is emitted to the outside of light flux controlling member 300 from first annular surface 232. At this time, since first annular surface 232 is substantially parallel to central axis CA, the light emitted at first annular surface 232 is not largely refracted. In addition, the light emitted from first annular surface 232 enters light flux controlling member 300 from second annular surface 234. At this time, since second annular surface 234 is disposed to approach the rear side from the center portion toward the outer periphery portion, the light incident on second annular surface 234 is largely refracted toward the front side. As described, a part of the light reflected on the rear side of reflection surface 220 is refracted toward the front side by first annular surface 232 and second annular surface 234. Then, the light refracted toward the front side is emitted to the outside of light flux controlling member 300 from emission surface 240.

Figure 10A:
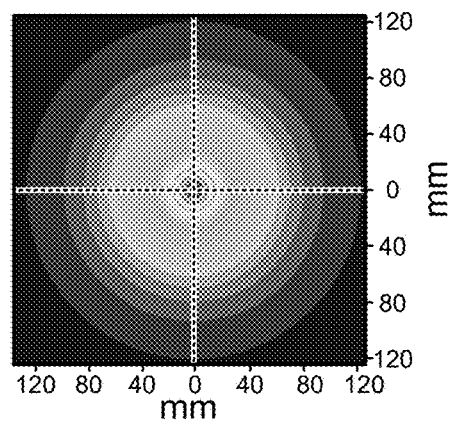
FIGS. 10A to 10C illustrate simulations of illuminance distributions using the light flux controlling members of Embodiment 2 and Comparative Example 2.
Figure 10B:
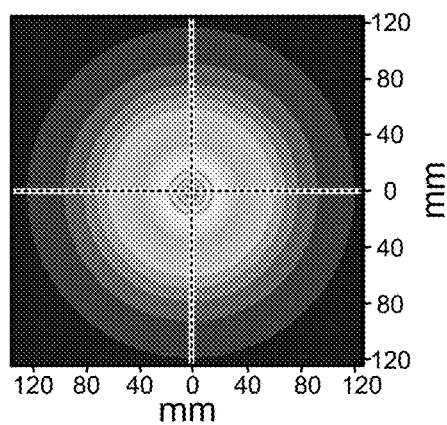
Figure 10C:
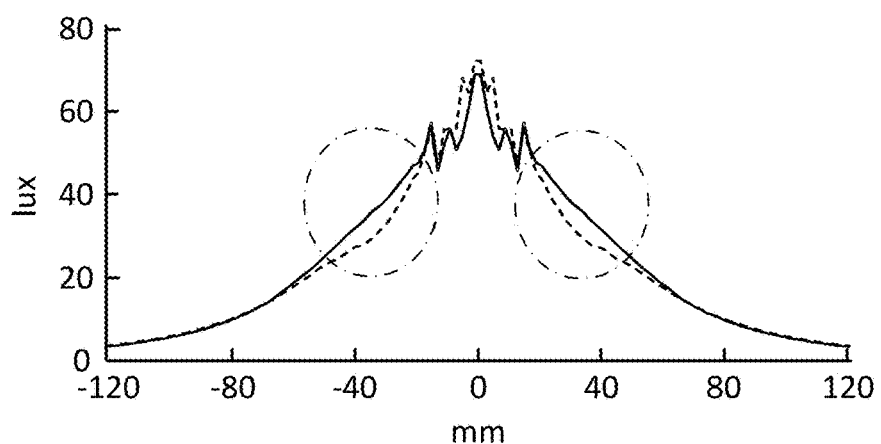

FIG. 10A shows an illuminance distribution on the diffusion plate in the case where light flux controlling member 300 according to Embodiment 2 is used, FIG. 10B shows an illuminance distribution on the diffusion plate in the case where light flux controlling member 300' according to the comparative example 2 is used, and FIG. 10C shows an illuminance distribution on the diffusion plate in a cross-section including optical axis LA. The ordinate and abscissa of FIG. 10A, the ordinate and abscissa of FIG. 10B, and the abscissa of FIG. 10C represent the distance (mm) from the intersection of optical axis LA and the diffusion plate. In addition, the ordinate of FIG. 10C represents the illuminance (lux). In addition, in FIG. 10C, the solid line represents an illuminance in the case where light flux controlling member 300 according to Embodiment 2, and the broken line represents an illuminance in the case where light flux controlling member 300' according to the comparative example 2 is used.

As illustrated in FIGS. 10A to 10C, when light flux controlling member 300 according to Embodiment 1 is used, the quantity of the light controlled toward the upper side is large in comparison with the case where light flux controlling member 300' according to the comparative example 2 is used (see, in particular, the dashed line in FIG. 10C). As described above, the reason for this is that a part of the light travelling in the lateral direction is refracted toward the front side mainly by first annular surface 232 and second annular surface 234.

(Effect)

As described above, light flux controlling member 300 according to Embodiment 2 has an effect similar to that of light flux controlling member 200 according to Embodiment 1. In addition, the weight of light flux controlling member 300 according to Embodiment 2 can be reduced in comparison with light flux controlling member 200 of Embodiment 1.

This application is entitled to and claims the benefit of Japanese Patent Application No. 2014-076152 filed on Apr. 2, 2014, the disclosure each of which including the specification, drawings and abstract is incorporated herein by reference in its entirety.

INDUSTRIAL APPLICABILITY

The light flux controlling member, the light-emitting device and the surface light source device according to the embodiments of the present invention are applicable to, for example, a backlight of liquid crystal display apparatuses or generally-used illumination apparatuses.

REFERENCE SIGNS LIST

100 Surface light source device
120 Housing
122 Bottom plate
124 Substrate
140 Light diffusion member
160 Light-emitting device
162 Light emitting element
180 Leg part
200, 200', 300, 300' Light flux controlling member
210, 310 Incidence surface
220 Reflection surface
230 Annular groove
232 First annular surface
234 Second annular surface
236 Ridgeline
240 Emission surface
312 Recessed surface
314 Rear surface
316 Inclined surface
350 Inspection reference surface
CA Central axis
LA Optical axis

The invention claimed is:

1. A light flux controlling member for controlling a distribution of light emitted from a light emitting element, the light flux controlling member comprising:
an incidence surface on which light emitted from the light emitting element is incident, the incidence surface being disposed on a rear side to intersect with a central axis of the light flux controlling member;
a reflection surface configured to reflect light incident on the incidence surface in a lateral direction, the reflection surface being disposed on a front side such that a distance from the light emitting element increases from a center portion toward an outer periphery portion of the reflection surface;
an annular groove including a first annular surface and a second annular surface and disposed on a rear side at a position outside the incidence surface to surround the central axis, the first annular surface being closest to the central axis in the annular groove, the second annular surface being disposed outside the first annular surface; and
an emission surface configured to emit light reflected by the reflection surface, the emission surface being disposed outside the annular groove to surround the central axis;
wherein the annular groove is disposed such that the annular groove does not intersect with a light path of light which is emitted from a center of the light emitting element and is incident on the incidence surface and then on the reflection surface in a region between a point of incidence of the light on the incidence surface and a point of reflection of the light at the reflection surface, and that the annular groove intersects with at least a part of a light path of light which is incident on the incidence surface from the light emitting element and is then reflected by the reflection surface toward the emission surface,
wherein the second annular surface is formed such that a width of the annular groove increases toward an opening edge of the annular groove from a valley part of the annular groove,
wherein a part of the light incident on the incidence surface from the light emitting element is reflected by the reflection surface towards the first annular surface, and is then refracted by the second annular surface toward the front side, and
wherein the valley part of the annular groove is disposed on the front side relative to a center portion of the reflection surface.

2. The light flux controlling member according to claim 1, wherein a cross-sectional shape including the central axis of the second annular surface is a straight line or a curved line.

3. The light flux controlling member according to claim 1, wherein the annular groove is rotationally symmetrical about the central axis.

4. A light-emitting device comprising:
the light emitting element and the light flux controlling member according to claim 1, wherein:
the light flux controlling member is disposed such that the central axis coincides with an optical axis of the light emitting element.

5. A surface light source device comprising:
the light-emitting device according to claim 4; and
a light diffusion member configured to allow light from the light-emitting device to pass therethrough while diffusing the light.

6. A display apparatus comprising:
the surface light source device according to claim 5; and
a display member to which light emitted from the surface light source device is applied.

* * * * *